(12) United States Patent
Yang et al.

(10) Patent No.: US 11,271,016 B2
(45) Date of Patent: Mar. 8, 2022

(54) ARRAY SUBSTRATE AND FABRICATION METHOD THEREOF, DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhaokun Yang, Beijing (CN); Xiang Feng, Beijing (CN); Ruizhi Yang, Beijing (CN); Yonglian Qi, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 785 days.

(21) Appl. No.: 16/068,034

(22) PCT Filed: Oct. 10, 2017

(86) PCT No.: PCT/CN2017/105494
§ 371 (c)(1),
(2) Date: Jul. 3, 2018

(87) PCT Pub. No.: WO2019/010849
PCT Pub. Date: Jan. 17, 2019

(65) Prior Publication Data
US 2021/0167091 A1 Jun. 3, 2021

(30) Foreign Application Priority Data
Jul. 10, 2017 (CN) .......................... 201710557038.2

(51) Int. Cl.
*H01L 27/12* (2006.01)
*H01L 27/146* (2006.01)

(52) U.S. Cl.
CPC .......... *H01L 27/124* (2013.01); *H01L 27/127* (2013.01); *H01L 27/14605* (2013.01);
(Continued)

(58) Field of Classification Search
CPC ............. H01L 27/124; H01L 27/14605; H01L 27/14649; H01L 27/14612; H01L 27/14692; H01L 27/127; H01L 27/14689
See application file for complete search history.

(56) References Cited

U.S. PATENT DOCUMENTS

| 6,746,905 B1 * | 6/2004 | Fukuda ................... H01L 27/12 257/E21.413 |
| 2002/0001886 A1 * | 1/2002 | Ohtani ............... G02B 27/0172 438/151 |

(Continued)

FOREIGN PATENT DOCUMENTS

| CN | 101417785 A | 4/2009 |
| CN | 106022276 A | 10/2016 |

(Continued)

OTHER PUBLICATIONS

Office Action dated Feb. 25, 2020, issued in counterpart CN Application No. 201710557038.2, with English Translation. (19 pages).

(Continued)

*Primary Examiner* — Jarrett J Stark
(74) *Attorney, Agent, or Firm* — Westerman, Hattori, Daniels & Adrian, LLP

(57) ABSTRACT

An array substrate is disclosed. The array substrate may include a base substrate, gate lines and data lines intersecting the gate lines on the base substrate. The gate lines and the data lines may define a plurality of pixel regions. Each of at least some of the plurality of the pixel regions may be provided with an image sensor. The image sensor may (Continued)

include a sensitive element, a first electrode at one end of the sensitive element, and a second electrode at the other end of the sensitive element. The image sensor may be configured to sense light having image information.

11 Claims, 6 Drawing Sheets

(52) U.S. Cl.
CPC .. *H01L 27/14612* (2013.01); *H01L 27/14649* (2013.01); *H01L 27/14689* (2013.01); *H01L 27/14692* (2013.01)

(56) References Cited

U.S. PATENT DOCUMENTS

| | | | |
|---|---|---|---|
| 2002/0014530 A1* | 2/2002 | Iihama | H01L 27/14601 235/454 |
| 2002/0027229 A1* | 3/2002 | Yamazaki | G09G 3/3275 257/84 |
| 2005/0117079 A1 | 6/2005 | Pak et al. | |
| 2006/0267948 A1 | 11/2006 | Takahashi | |
| 2007/0131936 A1 | 6/2007 | Kang et al. | |
| 2007/0291325 A1* | 12/2007 | Toyota | H01L 27/3234 358/474 |
| 2011/0212569 A1* | 9/2011 | Yamazaki | H01L 29/513 438/104 |
| 2013/0214279 A1 | 8/2013 | Nishimura et al. | |
| 2013/0299815 A1* | 11/2013 | Jackson | H01L 27/283 257/40 |
| 2015/0364527 A1 | 12/2015 | Wang et al. | |
| 2016/0154263 A1* | 6/2016 | Hatsu | H01L 29/7869 349/12 |
| 2017/0033132 A1* | 2/2017 | Huang | H01L 27/1259 |

FOREIGN PATENT DOCUMENTS

| | | |
|---|---|---|
| CN | 106200183 A | 12/2016 |
| JP | H09-053980 A | 2/1997 |
| JP | 2000-232213 A | 8/2000 |
| JP | 2005-107383 A | 4/2005 |
| JP | 2005-129948 A | 5/2005 |
| JP | 2006-330649 A | 12/2006 |
| JP | 2007-164127 A | 6/2007 |
| JP | 2009-128520 A | 6/2009 |
| JP | 2009-146100 A | 7/2009 |
| KR | 10-0831134 B1 | 5/2008 |
| KR | 10-2015-0142816 A | 12/2015 |
| WO | 2005/104234 A1 | 11/2005 |
| WO | 2011/135908 A1 | 11/2011 |

OTHER PUBLICATIONS

Office Action (Grant of Patent) dated Apr. 20, 2020, issued in counterpart KR Application No. 10-2018-7023735, with English Translation. (3 pages).

International Search Report dated Mar. 27, 2018, issued in counterpart International Application No. PCT/CN2017/105494. (10 pages).

Office Action dated Nov. 29, 2019, issued in counterpart KR application No. 10-2018-7023735, with English translation. (13 pages).

Extended (Supplementary) European Search Report dated Feb. 15, 2021, issued in counterpart EP Application No. 17894657.0 (8 pages).

Office Action dated Sep. 6, 2021, issued in counterpart JP Application No. 2018-540815, with English Translation. (14 pages).

* cited by examiner

ARRAY SUBSTRATE AND FABRICATION METHOD THEREOF, DISPLAY APPARATUS

CROSS-REFERENCE TO RELATED APPLICATIONS

This application claims benefit of the filing date of Chinese Patent Application No. 201710557038.2 filed on Jul. 10, 2017, the disclosure of which is hereby incorporated by reference.

TECHNICAL FIELD

This invention relates to a display technology, and more particularly, to an array substrate and fabrication method thereof and a display apparatus.

BACKGROUND

At present, in order to realize identification of a user's action on a display apparatus, it is necessary to use an expensive CCD (Charge-coupled Device)/CMOS (Complementary Metal Oxide Semiconductor) camera to capture the user's action. After the captured action is analyzed, corresponding operations are performed. Moreover, if a user's action needs to be identified at night, it is also necessary to use a four-axis motion memory sensor (Motion MEM sensor) to record the user's action. These apparatuses that realize the identification of a user's action currently are very expensive. In addition, it is difficult to integrate them into a display apparatus.

BRIEF SUMMARY

Accordingly, one example of the present disclosure is an array substrate. The array substrate may comprise a base substrate, gate lines and data lines intersecting the gate lines on the base substrate. The gate lines and the data lines may define a plurality of pixel regions. Each of at least some of the plurality of pixel regions may be provided with an image sensor. The image sensor may be configured to sense light having image information and comprise a sensitive element, a first electrode at one end of the sensitive element, and a second electrode at the other end of the sensitive element. The first electrode of the image sensor may be coupled to one of the gate lines and the second electrode of the image sensor may be coupled to a current detection line. In one embodiment, the first electrode of the image sensor may be coupled to the one of the gate lines through a connection electrode in a through hole of a gate insulating layer. The first electrode and the second electrode of the image sensor may be spaced apart, the sensitive element thereof may be on the first electrode and the second electrode, and the sensitive element may be suspended with respect to the gate insulating layer.

The array substrate may further comprise a driving thin-film transistor for displaying in each of the pixel regions. The driving thin-film transistor may comprise a gate electrode, a source electrode, a drain electrode, and an active layer. The sensitive element of the image sensor and the active layer of the driving thin-film transistor may be made of a same material.

The array substrate may further comprise a switching thin-film transistor configured to control the image sensor and comprising a gate electrode, a source electrode, a drain electrode, and an active layer. The drain electrode of the switching thin-film transistor may be coupled to the first electrode, the gate electrode of the switching thin-film transistor may be coupled to one of the gate lines, and the source electrode of the switching thin-film transistor may be coupled to a data input line. The drain electrode of the switching thin-film transistor and the first electrode may have a unitary structure. The sensitive element of the image sensor, the active layer of the driving thin-film transistor, and the active layer of the switching thin-film transistor may be made of a same material. The image sensor may be an infrared image sensor.

Another example of the present disclosure is a display apparatus. The display apparatus may comprise the array substrate according to one embodiment of the present disclosure. The display apparatus may further comprise a processing circuit coupled to the current detection line, and the process circuit may be configured to identify touch operations based on change in current on the current detection line.

Another example of the present disclosure is a method of fabricating an array substrate. In one embodiment, the method may comprise forming gate lines and gate electrodes of driving thin-film transistors on a base substrate; forming a gate insulating layer with through holes through the gate insulating layer; forming source electrodes of the driving thin-film transistors, drain electrodes of the driving thin-film transistors, data lines, first electrodes of image sensors, second electrodes of the image sensors, and current detection lines on the gate insulating layer by using a single mask plate; forming a transition layer between the first electrodes and the second electrodes; forming active layers of the driving thin-film transistors and the sensitive elements on the transition layer by using a single mask plate; and removing the transition layer to form the sensitive elements mounted on the first electrodes and the second electrodes.

The step of forming source electrodes of the driving thin-film transistors, drain electrodes of the driving thin-film transistors, data lines, first electrodes of image sensors, second electrodes of the image sensors, and current detection lines on the gate insulating layer may comprise forming a metal material layer on the gate insulating layer and patterning the metal material layer using a single mask plate to form the source electrodes of the driving thin-film transistors, the drain electrodes of the driving thin-film transistors, the data lines, the first electrodes of image sensors, the second electrodes of the image sensors, and the current detection lines. The active layers of the driving thin-film transistors and the sensitive elements may be made of amorphous-Si or low temperature polysilicon. The first electrodes and the second electrodes may be spaced apart, the second electrodes may be coupled to the current detection lines respectively, and the first electrodes may be coupled to the gate lines through the through holes of the gate insulating layer respectively.

In another embodiment, the method of fabricating an array substrate may comprise forming gate lines and gate electrodes of driving thin-film transistors on a base substrate; forming a gate insulating layer with through holes through the gate insulating layer; forming first electrodes, second electrodes, and data lines of image sensors, current detection lines, data lines, source electrodes and drain electrodes of the driving thin-film transistors, and source electrodes and drain electrodes of switching thin-film transistor on the gate insulating layer by using a single mask plate; forming a transition layer between the first electrodes and the second electrodes; forming active layers of the driving thin-film transistors, active layers of the switching thin-film transistor, and the sensitive elements on the transition layer by using a single mask plate; and removing the transition layer to form the sensitive elements mounted on the first electrodes and the second electrodes.

The step of forming first electrodes, second electrodes, and data lines of image sensors, current detection lines, data lines, source electrodes and drain electrodes of the driving thin-film transistors, and source electrodes and drain electrodes of switching thin-film transistor on the gate insulating layer may comprise forming a metal material layer on the gate insulating layer and patterning the metal material layer using a single mask plate to form the first electrodes, the second electrodes, and the data lines of image sensors, the current detection lines, the data lines, the source electrodes and the drain electrodes of the driving thin-film transistors, and the source electrodes and the drain electrodes of the switching thin-film transistor on the gate insulating layer.

The first electrodes and the second electrodes may be spaced apart, the drain electrodes of the switching thin-film transistors may be coupled to the first electrodes respectively, the source electrodes of the switching thin-film transistors may be coupled to the data input lines respectively, and the second electrodes may be coupled to the current detection lines respectively. The active layers of the driving thin-film transistors, the active layers of the switching thin-film transistor, and the sensitive elements may be made of amorphous-Si or low temperature polysilicon. The sensitive element may be suspended with respect to the gate insulating layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
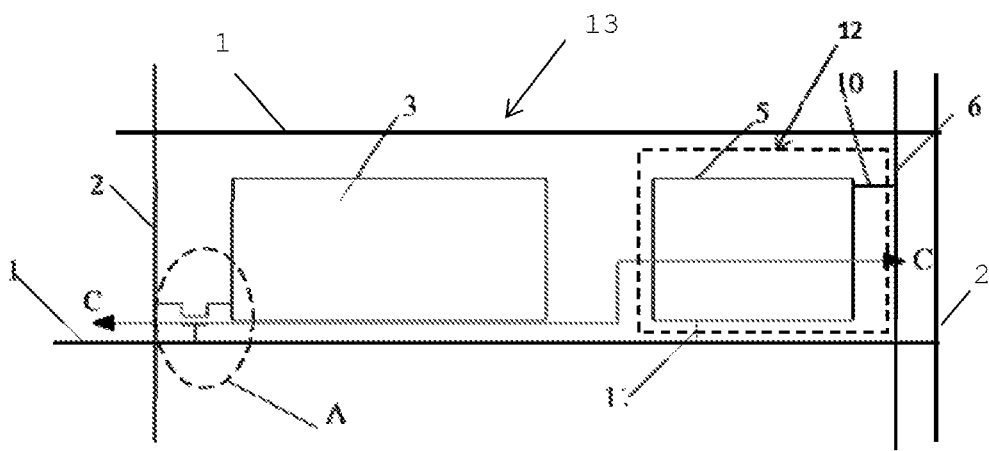
FIG. 1 is a schematic partial plan view of an array substrate according to one embodiment of the present disclosure.

The present invention will be described in further detail with reference to the accompanying drawings and embodiments in order to provide a better understanding of the technical solutions of the present invention by those skilled in the alt Throughout the description of the invention, reference is made to FIGS. 1-6. When referring to the figures, like structures and elements shown throughout are indicated with like reference numerals.

The apparatuses for identifying a user's action in the prior art currently are relatively expensive. Furthermore, it is difficult to integrate them into a display apparatus. In order to address these issues, an array substrate and a method of fabricating the same, and a display apparatus capable of realizing identification of a user's touching operation with low cost are provided in the present disclosure.

Accordingly, one example of the present disclosure is an array substrate. The array substrate includes gate lines and data lines intersecting the gate lines on a base substrate. The gate lines and the data lines define a plurality of pixel regions. In the pixel regions, driving thin-film transistors for displaying are provided respectively. The array substrate further comprises image sensors 12 in at least some of the pixel regions respectively. The image sensor 12 includes a sensitive element, a first electrode at one end of the sensitive element, and a second electrode at the other end of the sensitive element.

In the present embodiment, the image sensors are provided on the base substrate, and the image sensors are located on the same base substrate as the driving thin-film transistors. As such, a display apparatus is capable of integrating structure and function of the image sensors and realizes identification of a user's touch action at low cost.

In one embodiment, the sensitive elements of the image sensors are made of a semiconductor material. The sensitive elements can be prepared with the same material as active layers of the driving thin-film transistors of the array substrate. As such, the sensitive elements of the image sensors can be formed in the same patterning process or using a single mask plate as the active layers of the driving thin-film transistors of the array substrate. Accordingly, the image sensors can be formed with the display apparatus at the same time.

The above-mentioned "some of the pixel regions" means that a distribution of the pixel regions having the image sensors on the substrate can satisfy at least functions to be performed by the image sensors. According to requirements for accuracy of capturing and imaging etc., different types of image sensors have different requirements on density of regional distribution thereof. For example, infrared image sensors can achieve imaging capture at a lower distribution density. However, depth image sensors need a relatively high distribution density to achieve accurate depth and 3D capture and identification. In embodiments of the present disclosure, the "some of pixel regions" means, for example, not less than 30% of all pixel regions, or not less than 50% of all pixel regions, or not less than 80% of all pixel regions, or all pixel regions.

In one embodiment, the pixel regions having the image sensors are uniformly distributed on the base substrate, thereby improving uniformity of image sensing.

In one embodiment, the image sensor may be an infrared image sensor. The infrared image sensor can sense and identify a user's touch action, gesture and action during both day and night.

FIG. 1 is a schematic partial plan view of an array substrate according to one embodiment of the present disclosure. As shown in FIG. 1, there are gate lines 1 arranged in rows, data lines 2 arranged in columns, and current detection lines 6 on the base substrate. The gate lines 1 and the data lines 2 define a plurality of pixel regions 13. In each of the pixel regions 13, a driving thin-film transistor A used for displaying is provided. A gate of the driving thin-film transistor A is coupled to a gate line 1. A source thereof is coupled to a data line 2. A drain thereof is coupled to a pixel electrode 3. In each of at least some of the pixel regions, an image sensor is also provided. As shown in FIG. 1, the image sensor comprises a sensitive element 5, a first electrode 11 at one end of the sensitive element 5 and a second electrode 10 at the other end of the sensitive element 5. The first electrode 11 is coupled to the gate line 1, and the second electrode 10 is coupled to a current detection line 6 of the sensitive element.

Figure 2:
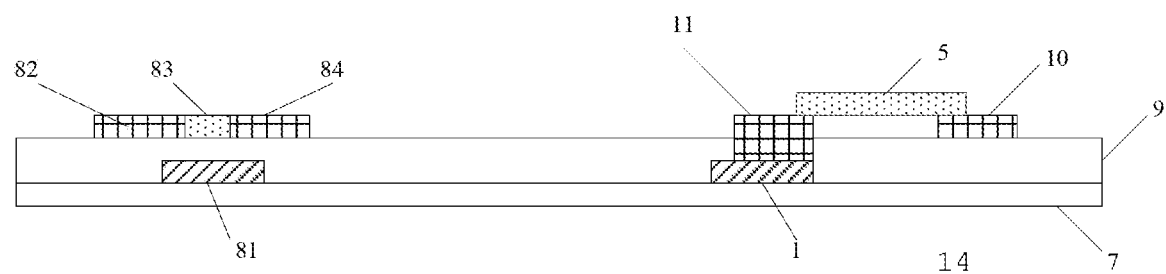
FIG. 2 is a schematic cross-sectional view of the array substrate along a line CC shown in FIG. 1.

FIG. 2 is a schematic cross-sectional view of the array substrate along a line CC shown in FIG. 1. In one embodiment, as shown in FIG. 2, the array substrate comprises the following:

a base substrate 7, a gate line 1 and a gate electrode 81 of a driving thin-film transistor on the base substrate 7, a gate insulating layer 9, a source electrode 82 of the driving thin-film transistor, a drain electrode 84 of the driving thin-film transistor, an active layer 83 of the driving thin-film transistor, a data line 2 on the gate insulating layer 9, a first electrode 11, a second electrode 10, a current detection line 6 on the gate insulating layer 9, and a sensitive element 5 mounted on the first electrode 11 and the second electrode 10.

The first electrode 11 and the second electrode 10 are spaced apart by a predetermined distance. The second electrode 10 is coupled to the current detection line 6. The first electrode 11 is coupled to the gate line 1 through a connection electrode 14 in a through hole of the gate insulating layer 9.

The sensitive element 5 and the active layer 83 may be made of the same material and formed by a single patterning process or using a single mask plate. The sensitive element 5 is suspended with respect to the gate insulating layer 9.

When the image sensor is in operation, light including infrared light is irradiated onto the sensitive element 5 so as to raise a temperature thereof, thereby changing a resistance of the sensitive element 5. By detecting an amount of the change of the resistance of the sensitive element 5, a change of the light intensity can be detected, thereby realizing image sensing. As can be seen from FIGS. 1 and 2, a voltage of the gate line 1 is applied to the sensitive element 5 of the image sensor. A potential of the current detection line 6 is constant. As such, by detecting a change in a current of the current detection line 6, the change of the resistance of the sensitive element 5 can be measured. Accordingly, the change of the light intensity can be obtained.

Figure 3:
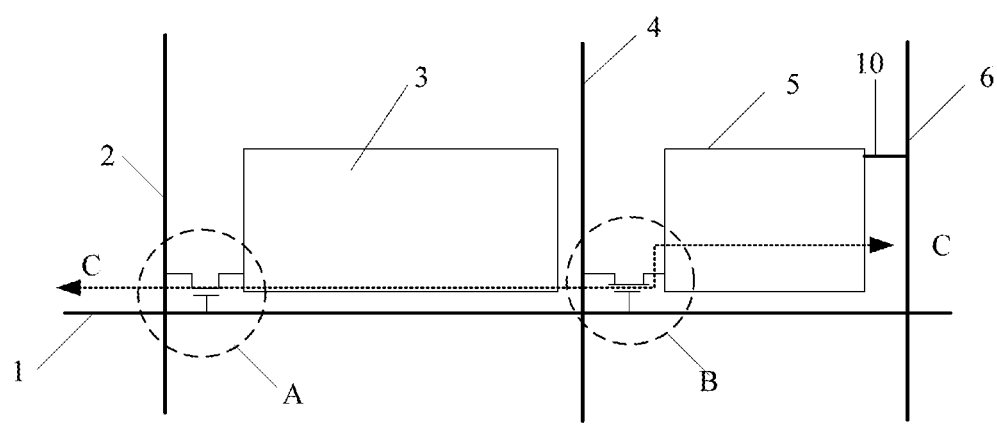
FIG. 3 is a schematic partial plan view of an array substrate according to one embodiment of the present disclosure.

FIG. 3 is a schematic partial plan view of an array substrate according to one embodiment of the present disclosure. As shown in FIG. 3, there are gate lines 1 arranged in rows, data lines 2 arranged in columns, data input lines 4 and current detection lines 6 on the substrate. The gate lines 1 and the data lines 2 may define a plurality of pixel regions. Driving thin-film transistors A used for displaying are provided in the pixel regions respectively. In one embodiment, a gate of the driving thin-film transistor A is coupled to a gate line 1. A source thereof is coupled to a data line 2. A drain thereof is coupled to a pixel electrode 3. In each of at least some of the pixel regions, an image sensor is provided. The image sensor comprises a sensitive element 5, a first electrode 11 at one end of the sensitive element 5, and a second electrode 10 at the other end of the sensitive element 5. The array substrate may further include a switching thin-film transistor B coupled to the gate line for controlling the image sensor and a data input line 4 on the base substrate. A drain electrode of the switching thin-film transistor is coupled with the first electrode. A gate electrode of the switching thin-film transistor is coupled to the gate line 1. A source electrode of the switching thin-film transistor is coupled to the data input line 4. The drain electrode of the switching thin-film transistor and the first electrode may form a unitary structure.

Figure 4:
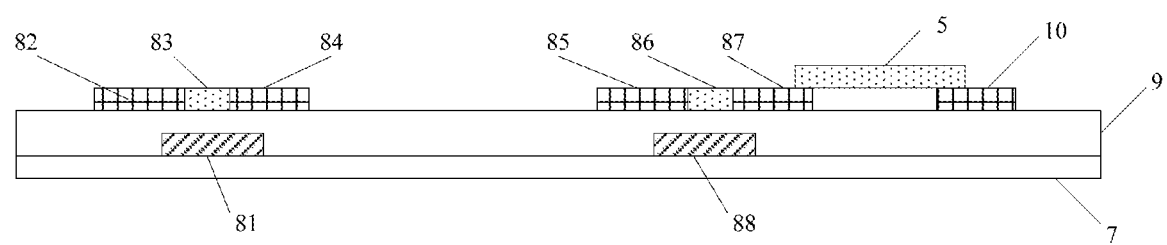
FIG. 4 is a schematic cross-sectional view of the array substrate along a line CC shown in FIG. 3.

FIG. 4 is a schematic cross-sectional view of the array substrate along a line CC as shown in FIG. 3. In one embodiment, as shown in FIG. 4, the array substrate includes:

a base substrate 7, a gate line 1, a gate electrode 81 of a driving thin-film transistor, and a gate electrode 88 of a switching thin-film transistor on the base substrate 7, wherein the gate electrode 81 of the driving thin-film transistor and the gate electrode of the switching thin-film transistor 88 are both coupled to the gate line 1, a gate insulating layer 9, a source electrode 82 of the driving thin-film transistor, a drain electrode 84 thereof, an active layer 83 thereof, a data line 2 on the gate insulating layer 9, a source electrode 85 of the switching thin-film transistor, a drain electrode 87 of the switching thin-film transistor, an active layer 86 of the switching thin-film transistor, a first electrode 11, a second electrode 10, and a data input line 4, and a current detection line 6.

The first electrode 11 and the second electrode 10 are spaced apart by a predetermined distance. The drain electrode of the switching thin-film transistor 87 is coupled to the first electrode. The first electrode and the drain electrode 87 may be an integral structure. The source electrode of the switching thin-film transistor 85 is coupled to the data input line 4. The second electrode thereof 10 is coupled to the current detection line 6. The sensitive element 5 is mounted on the first electrode and the second electrode 10. The sensitive element 5 may be made of the same material and formed by a single patterning process or using a single masking plate as the active layer 83 and the active layer 86. The sensitive element 5 is suspended with respect to the gate insulating layer 9.

When the image sensor is in operation, light including infrared light is irradiated onto the sensitive element 5 so as to raise a temperature thereof, thereby changing a resistance of the sensitive element 5. By detecting an amount of the change of the resistance of the sensitive element 5, a change of the light intensity can be detected, thereby realizing image sensing. As can be seen from FIGS. 3 and 4, a voltage of the gate line 1 is applied to the gate of the switching thin-film transistor so that the switching thin-film transistor is turned on. A voltage on the data input line 4 is applied to the sensitive element 5 of the image sensor through the switching thin-film transistor. A potential of the current detection line 6 is constant. As such, by detecting a change of current of the current detection line 6, the change of the resistance of the sensitive element 5 can be measured. Accordingly, the change of light intensity can be obtained.

Another example of the present disclosure is a display apparatus. The display apparatus comprises an array substrate according to one embodiment of the present disclosure, and a processing circuit coupled to the current detection line of the sensitive element. The processing circuit is used for identifying touch operations based on the change of the current on the current detection line of the sensitive element. The display apparatus may be any product or component having a display function such as a television, a display, a digital photo frame, a mobile phone, a tablet computer, or the like. The display apparatus may further comprise a flexible circuit board, a printed circuit board, and a backplane.

Another example of the present disclosure is a method for fabricating the array substrate according to one embodiment of the present disclosure. In one embodiment, the method comprises forming gate lines and data lines intersecting the gate lines on a base substrate. The gate lines and data lines define a plurality of pixel regions. Driving thin-film transistors used for displaying are formed in the pixel regions respectively. The method may further include the following step: forming image sensors in at least some of the pixel regions. The image sensor includes a sensitive element, a first electrode at one end of the sensitive element, and a second electrode at the other end of the sensitive element.

In the present embodiment, image sensors are formed on the substrate. The image sensors and the driving thin-film transistors are located on the same substrate so that a display apparatus can integrate structure and function of the image sensors and identify a user's touch action, action, and gestures at relatively low cost.

In one embodiment, the sensitive elements of the image sensors are made of semiconductor materials, and the sensitive elements can be prepared with the same material as the active layers of the driving thin-film transistors of the array substrate. As such, the sensitive elements of the image sensors can be formed in a same patterning process or using a single masking plate as the active layers of the driving thin-film transistors of the array substrate at the same time. Accordingly, the image sensors can be prepared at the same time that the display apparatus is prepared.

In one embodiment, the image sensor may be an infrared image sensor. The infrared image sensor can identify a users touch action, action, gestures, etc. during both day and night.

Furthermore, the fabrication method may comprise forming first electrodes and second electrodes of the image sensors, source electrodes and drain electrodes of the driving thin-film transistors using a same patterning process or a single masking plate.

In one embodiment, when fabricating the array substrate as shown in FIGS. 1 and 2, the fabricating method may include the following: forming the first electrodes 11 and the second electrodes 10 of the image sensors, the data lines 2, the source electrodes of the driving thin-film transistors 82, the drain electrodes thereof 84, and the current detection lines 6 using a same patterning process or using a single mask plate.

Figure 5:
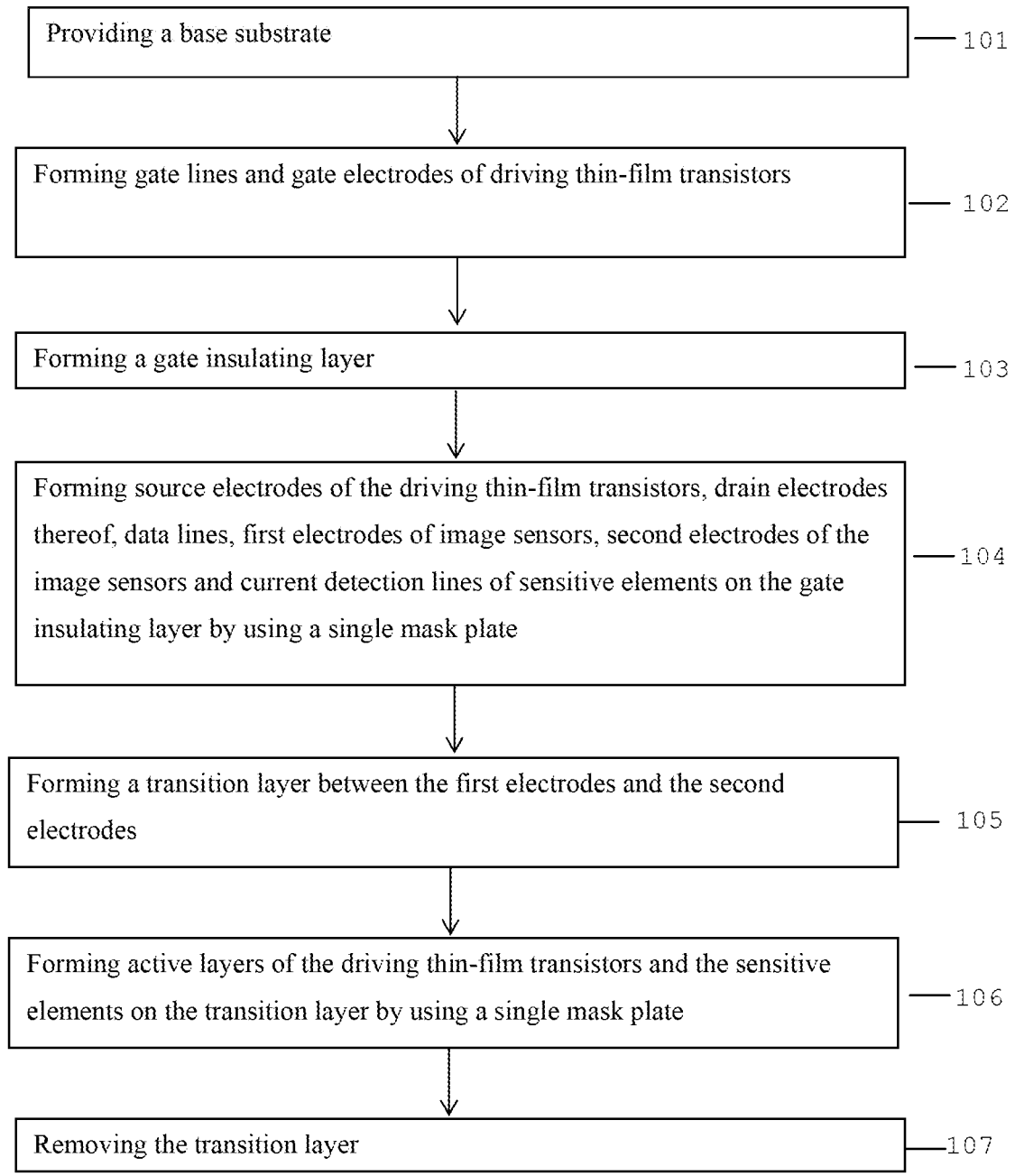
FIG. 5 is a flow chart of a method of fabricating an array substrate according to one embodiment of the present disclosure.

FIG. 5 is a flow chart of a method of fabricating an array substrate according to one embodiment of the present disclosure. The image sensors and the current detection lines 6 of the sensitive element may be fabricated during a process of fabricating the driving thin-film transistors and the gate lines 1 and the data lines 2. As shown in FIG. 5, the fabrication method may include the following:

During step 101, a base substrate 7 is provided. In one embodiment, the base substrate 7 may be a hard substrate such as a glass substrate or a quartz substrate. In another embodiment, the base substrate 7 may also be a flexible substrate such as a polyimide substrate.

During step 102, gate lines 1 and gate electrodes of driving thin-film transistors 81 are formed on the base substrate 7 by a single patterning process or by using a single mask plate. The gate lines 1 and the gate electrodes 81 may be made of a metal such as Cu, Al, Ag, Mo, Cr, Nd, Ni, Mn, Ti, Ta, W, or alloys of these metals. The gate lines 1 and the gate electrodes 81 can have a single-layer structure or a multi-layer structure. The multi-layer structure may be Cu/Mo, Ti/Cu/Ti, Mo\Al\Mo etc.

During step 103, a gate insulating layer 9 is formed. Through holes through the gate insulating layer 9 are also formed. The gate insulating layer 9 may be selected from oxides, nitrides or oxynitrides. The corresponding reaction gases are $SiH_4$, $NH_3$, $N_2$ or $SiH_2Cl_2$, $NH_3$, $N_2$.

During step 104, source electrodes of the driving thin-film transistors 82, drain electrodes thereof 84, data lines 2, first electrodes 11 of image sensors, second electrodes 10 of the image sensors and current detection lines 6 are formed on the gate insulating layer 9 by a single patterning process or using a single mask plate. The first electrodes 11 and the second electrodes 10 are spaced apart in a predetermined distance. The second electrodes 10 are coupled to the current detection lines 6 respectively. The first electrodes 11 are coupled to the gate lines 1 through the through holes of the gate insulating layer 9. The source electrodes of the driving thin-film transistors 82, the drain electrodes thereof 84, the data lines 2, the first electrodes 11, the second electrodes 10, and the current detection lines 6 of the sensitive elements of the image sensors may be made of Cu, Al, Ag, Mo, Cr, Nd, Ni, Mn, Ti, Ta, W or alloys of these metals. They can be a single-layer structure or a multi-layer structure. In one embodiment, the multi-layer structure may be Cu/Mo, Ti/Cu/Ti, or Mo/Al/Mo etc.

During step 105, a transition layer is formed between the first electrodes 11 and the second electrodes 10. The transition layer may be a photoresist layer between the first electrodes 11 and the second electrodes 10.

During step 106, active layers of the driving thin-film transistors 83 and the sensitive elements 5 on the transition layer are formed by a single patterning process. There are overlapping regions between an orthographic projection of the sensitive element 5 on the base substrate 7 and that of the first electrode 11 on the substrate 7 as well as between the orthographic projection of the sensitive element 5 on the substrate 7 and that of the second electrode 10 on the substrate 7. In one embodiment, the active layers and the sensitive elements 5 may be made of a semiconductor material such as amorphous-Si (a-Si) or low temperature polysilicon (LTPS)

During step 107, the transition layer is removed to form the sensitive elements 5 mounted on the first electrodes 11 and the second electrodes 10. In one embodiment, a NaOH solution may be used to dissolve the photoresist layer beneath the sensitive elements 5 to form suspended structures.

In one embodiment, the fabrication method further includes forming switching thin-film transistors, which are coupled to the gate lines respectively and used to control the image sensors. The first electrodes and the second electrodes of the image sensors, the source electrodes and the drain electrodes of the driving thin-film transistors, and the source electrodes and the drain electrodes of the switching thin-film transistors may be formed by a same patterning process or using a single mask plate.

In one embodiment, when an array substrate shown in FIGS. 3 and 4 is fabricated, the fabrication method includes forming switching thin-film transistors coupled to the gate lines 1 and data input lines 4 on the base substrate 7. The first electrodes 11, the second electrodes 10, the data input lines 4, the current detection lines 6, the data lines 2, the source electrodes 82 and the drain electrodes 84 of the driving thin-film transistors, the source electrodes 85 and the drain electrodes 87 of the switching thin-film transistors 85 may be formed by a same patterning process or using a single mask plate.

Figure 6:
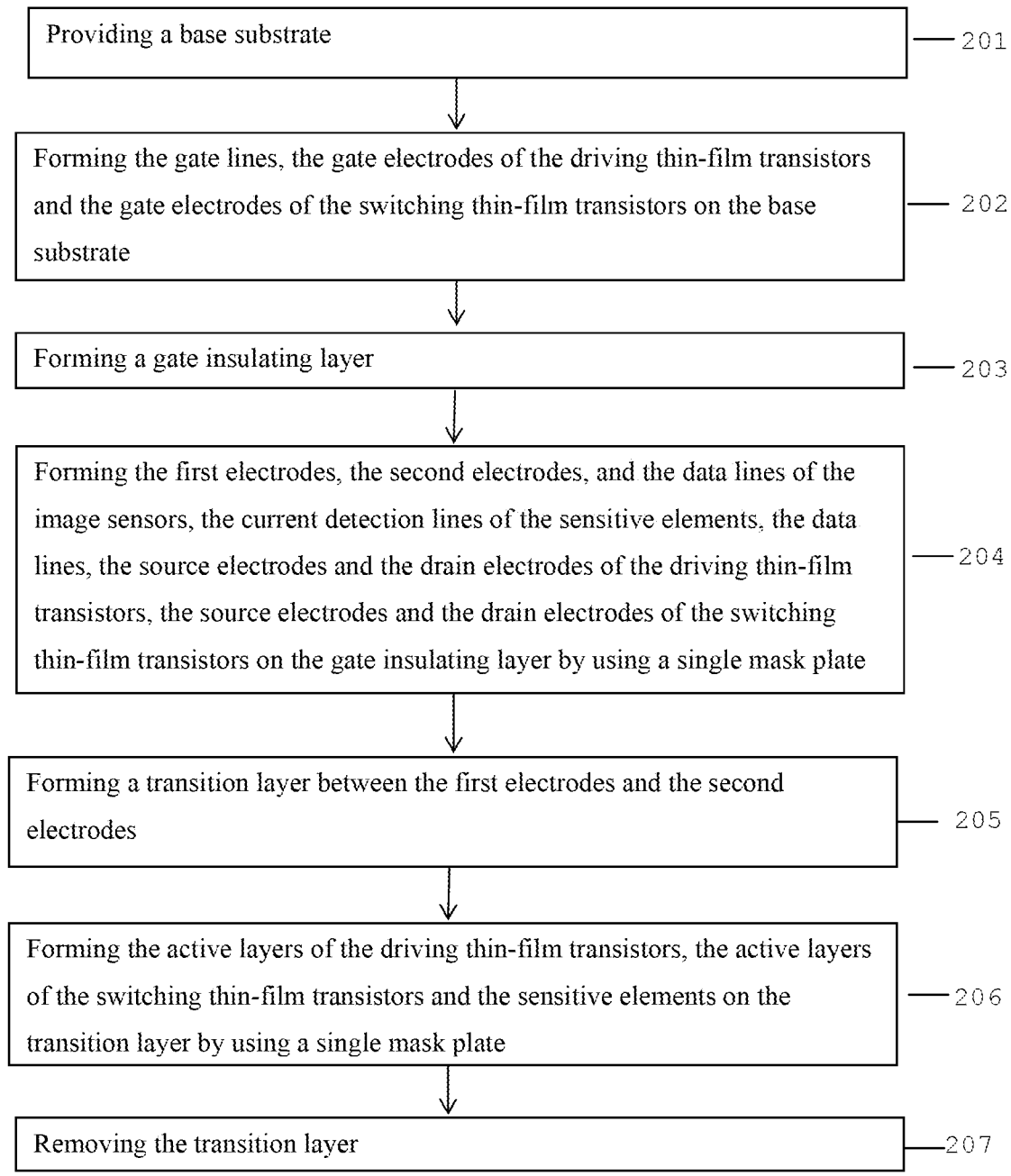
FIG. 6 is a flow chart of a method of fabricating an array substrate according to one embodiment of the present disclosure.

FIG. 6 is a flow chart of a method of fabricating an array substrate according to one embodiment of the present disclosure.

As shown in FIG. 6, the fabrication method comprises the following steps:

During step 201, a base substrate 7 is provided. In one embodiment, the base substrate 7 may be made of a hard substrate such as a glass substrate or a quartz substrate or a flexible substrate such as a polyimide substrate.

During step 202, the gate lines 1, the gate electrodes 81 of the driving thin-film transistors and the gate electrodes of the switching thin-film transistors 88 are formed on the base substrate 7 by a single patterning process or using a single mask plate. The gate electrodes of the driving thin-film transistors 81 and the gate electrodes of the switching thin-film transistors 88 are both coupled to the gate lines 1. The gate lines 1, the gate electrodes 81 of the driving thin-film transistors, and/or the gate electrodes of the switching thin-film transistors 88 may be made of a metal such as Cu, Al, Ag, Mo, Cr, Nd, Ni, Mn, Ti, Ta, W, or alloys of these metals. The gate lines 1, the gate electrodes 81 the driving thin-film transistors, and/or the gate electrodes of the switching thin-film transistors 88 may have a single-layer stricture or a multi-layer stricture such as Cu\Mo, Ti\Cu\Ti, or Mo\Al\Mo etc.

During step 203, a gate insulating layer 9 is formed. The gate insulating layer 9 may be made of a material selected from oxides, nitrides or oxynitrides. The corresponding reaction gases are $SiH_4$, $NH_3$, $N_2$ or $SiH_2Cl_2$, $NH_3$, $N_2$.

During step 204, the first electrodes of the image sensors 11, the second electrodes 10 of the image sensors, the data input lines 4, the current detection lines 6, the data lines 2, the source electrodes 82 of the driving thin-film transistors, the drain electrodes 84 of the driving thin-film transistors, the source electrodes 85 of the switching thin-film transistors, and the drain electrodes 87 of the switching thin-film transistors are formed on the gate insulating layer 9 by a single patterning process or using a single masking plate. The first electrodes 11 and the second electrodes 10 are spaced apart in a predetermined distance. The drain electrodes of the switching thin-film transistors 87 are coupled to the first electrodes 11. The source electrodes of the switching thin-film transistors 85 are coupled to the data input lines 4. The second electrodes 10 are coupled to the current detection lines 6. The first electrodes 11 and the second electrodes 10 of the image sensors, the data input lines 4, the current detection lines 6, the data lines 2, the source electrodes 82 and the drain electrodes 84 of the driving thin-film transistors, the source electrodes 85 and the drain electrodes 87 of the switching thin-film transistors may be made of a metal such as Cu, Al, Ag, Mo, Cr, Nd, Ni, Mn, Ti, Ta, W, or alloys of these metals, and may have a single-layer structure or a multi-layer structure such as Cu/Mo, Ti/Cu/Ti, Mo/Al/Mo etc. In one embodiment, the first electrode 11 and the corresponding drain electrode 87 of the switching thin-film transistor are an integral structure.

During step 205, a transition layer is formed between the first electrodes 11 and the second electrodes 10. The transition layer may be a photoresist layer located between the first electrodes 11 and the second electrodes 10.

During step 206, the active layers 83 of the driving thin-film transistors, the active layers 86 of the switching thin-film transistors and the sensitive elements 5 on the transition layer are formed by a single patterning process or using a single mask plate. There are overlapping regions between an orthographic projection of the sensitive element 5 on the base substrate 7 and that of the corresponding first electrode 11 on the base substrate 7 as well as between the orthographic projection of the sensitive element 5 on the base substrate 7 and that of the corresponding second electrode 10 on the base substrate 7. In one embodiment, the active layers and the sensitive elements 5 may be made of a semiconductor material such as a-Si or LTPS.

During step 207, the transition layer is removed so as to form the sensitive elements 5 mounted on the first electrodes 11 and the second electrodes 10. In one embodiment, a NaOH solution may be used to dissolve the photoresist layer beneath the sensitive elements 5 to form suspended structures.

Unless otherwise defined, technical terms or scientific terms used in this disclosure should be of ordinary meaning understandable to those of ordinary skill in the art to which this disclosure pertains. The "first", "second" and similar words used in this disclosure do not denote any order, quantity or importance, but only to distinguish between different components. "Including" or "comprising" or similar terms means that the elements or objects preceding the word cover the elements or objects listed after the word and their equivalents, but not excludes other elements or objects. Coupled or connected, and the like are not limited to physical or mechanical connections, but may also include electrical connections, whether direct or indirect. "Up", "down", "left", "right" and so on are used only to represent the relative positional relationship. When the absolute position of the object to be described changes, the relative positional relationship may also change accordingly. When an element such as a layer, a film, a region or a substrate is referred to as being "on" or "under" another element, the element may be "directly" located on or under another element, or there may be an intermediate element.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

DESCRIPTION OF SYMBOLS IN THE DRAWINGS

1. Gate line
2. Data line
3. Pixel electrode
4. Data input line
5. Sensitive element
6. Current detection line
7. Base Substrate
81. Gate of driving thin-film transistor
82. Source of driving thin-film transistor
83. Active layer of driving thin-film transistor
84. Drain of driving thin-film transistor
88. Gate of switching thin-film transistor
85. Source of switching thin-film transistor
86. Active layer of switching thin-film transistor
87. Drain of switching thin-film transistor
9. Gate insulating layer
10. The second electrode
11. The first electrode
12. Image sensor
13. Pixel region
14. Connection electrode
A. driving thin-film transistor
B. switching thin-film transistor

What is claimed is:

1. An array substrate comprising:

a base substrate, gate lines and data lines intersecting the gate lines on the base substrate, the gate lines and the data lines defining a plurality of pixel regions, a gate insulating layer disposed on the base substrate, wherein each of at least some of the plurality of the pixel regions is provided with an image sensor, the image sensor is configured to sense light having image information, and comprises a sensitive element, a first electrode at one end of the sensitive element and a second electrode at an other end of the sensitive element; and the first electrode and the second electrode of the image sensor are disposed on the gate insulating layer, the first electrode and the second electrode of the image sensor are spaced apart to form a trench on the gate insulating layer, the sensitive element thereof is on the first electrode and the second electrode, and the sensitive element is suspended over the trench between the first electrode and the second electrode.

2. The array substrate according to claim 1, wherein the first electrode of the image sensor is coupled to one of the gate lines and the second electrode of the image sensor is coupled to a current detection line.

3. The array substrate according to claim 2, wherein the first electrode of the image sensor is coupled to the one of the gate lines through a connection electrode in a through hole of a gate insulating layer.

4. The array substrate according to claim 3, wherein the sensitive element of the image sensor and the active layer of the driving thin-film transistor are made of a same material and fabricated at a same process.

5. The array substrate according to claim 1, further comprising:

a driving thin-film transistor for displaying in each of the pixel regions, wherein the driving thin-film transistor comprises a gate electrode, a source electrode, a drain electrode, and an active layer.

6. The array substrate according to claim 5, the sensitive element of the image sensor and the active layer of the driving thin-film transistor are made of a same material.

7. The array substrate according to claim 1, further comprising:

a switching thin-film transistor configured to control the image sensor and comprising a gate electrode, a source electrode, a drain electrode, and an active layer; and wherein the drain electrode of the switching thin-film transistor is coupled to the first electrode, the gate electrode of the switching thin-film transistor is coupled to one of the gate lines, and the source electrode of the switching thin-film transistor is coupled to a data input line.

8. The array substrate according to claim 7, wherein the drain electrode of the switching thin-film transistor and the first electrode have a unitary structure.

9. The array substrate according to claim 7, wherein the sensitive element of the image sensor, the active layer of the driving thin-film transistor, and the active layer of the switching thin-film transistor are made of a same material.

10. The array substrate according to claim 1, wherein the image sensor is an infrared image sensor.

11. A display apparatus comprising the array substrate according to claim 1, wherein the display apparatus further comprises a processing circuit coupled to the current detection line, and the process circuit is configured to identify touch operations based on change in current on the current detection line.

* * * * *